United States Patent
Feng et al.

(10) Patent No.: US 8,842,706 B2
(45) Date of Patent: Sep. 23, 2014

(54) OPTO-ELECTRONIC OSCILLATOR AND METHOD

(71) Applicant: The Board of Trustees of The University of Illinois, Urbana, IL (US)

(72) Inventors: Milton Feng, Champaign, IL (US); Nick Holonyak, Jr., Urbana, IL (US); Han Wui Then, Hillsboro, OR (US); Mark Stuenkel, Morganton, NC (US); Fei Tan, Urbana, IL (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 86 days.

(21) Appl. No.: 13/633,440

(22) Filed: Oct. 2, 2012

(65) Prior Publication Data

US 2013/0094532 A1    Apr. 18, 2013

Related U.S. Application Data

(60) Provisional application No. 61/627,230, filed on Oct. 7, 2011, provisional application No. 61/686,202, filed on Mar. 30, 2012.

(51) Int. Cl.
*H01S 3/30* (2006.01)
*H01S 3/00* (2006.01)
*G02F 1/01* (2006.01)
*H03D 9/00* (2006.01)

(52) U.S. Cl.
CPC ............... *G02F 1/0123* (2013.01); *H03D 9/00* (2013.01)
USPC .................................. 372/38.03; 372/7; 372/8

(58) Field of Classification Search
USPC .................................... 372/7, 8, 29.03, 38.03
See application file for complete search history.

(56) References Cited

U.S. PATENT DOCUMENTS

| | | | |
|---|---|---|---|
| 4,710,936 A | 12/1987 | Shibata et al. | 372/45 |
| 5,796,714 A | 8/1998 | Chino et al. | 372/50 |
| 6,479,844 B2 | 11/2002 | Taylor | 257/192 |
| 6,727,530 B1 | 4/2004 | Shen et al. | 257/184 |
| 6,974,969 B2 | 12/2005 | Taylor | 257/24 |
| 7,091,082 B2 | 8/2006 | Feng et al. | 438/235 |
| 7,247,892 B2 | 7/2007 | Taylor | 257/197 |
| 7,286,583 B2 | 10/2007 | Feng et al. | 372/30 |
| 7,354,780 B2 | 4/2008 | Feng et al. | 257/292 |
| 7,535,034 B2 | 5/2009 | Walter et al. | 372/43 |
| 7,711,015 B2 | 5/2010 | Holonyak, Jr. et al. | 372/11 |

(Continued)

FOREIGN PATENT DOCUMENTS

JP    61270885    12/1986

OTHER PUBLICATIONS

Ledistor—A Three Terminal Double Heterostructure Optoelectronic Switch, G.W. Taylor et al., Appl. Phys. Lett. 50, 6 (1987).

(Continued)

*Primary Examiner* — Armando Rodriguez
(74) *Attorney, Agent, or Firm* — Martin Novack

(57) ABSTRACT

An opto-electronic oscillator circuit, including: an opto-electronic circuit loop including an optical modulator that receives a first electrical signal and produces an optical output signal coupled with an optical resonator, a photodetector circuit optically coupled with the optical resonator, and a phase shifter coupled with the photodetector circuit for producing a phase shifted output signal that is fed back as the first electrical signal; an optical loop comprising the optical coupling of the optical resonator with the photodetector; and an electrical feedback circuit loop for coupling the first electrical signal with the photodetector circuit.

19 Claims, 5 Drawing Sheets

(56) References Cited

U.S. PATENT DOCUMENTS

| | | | | |
|---|---|---|---|---|
| 7,813,396 | B2 | 10/2010 | Feng et al. | 372/43.01 |
| 7,869,472 | B2 | 1/2011 | Maleki et al. | 372/20 |
| 7,998,807 | B2 | 8/2011 | Feng et al. | 438/235 |
| 2005/0040387 | A1 | 2/2005 | Feng et al. | 257/14 |
| 2005/0040432 | A1 | 2/2005 | Feng et al. | 257/198 |
| 2005/0054172 | A1 | 3/2005 | Feng et al. | 438/313 |
| 2008/0089368 | A1 | 4/2008 | Feng et al. | 372/25 |
| 2008/0240173 | A1 | 10/2008 | Holonyak et al. | 372/9 |
| 2009/0134939 | A1 | 5/2009 | Feng et al. | 327/581 |
| 2010/0034228 | A1 | 2/2010 | Holonyak et al. | 374/45 |
| 2010/0073086 | A1 | 3/2010 | Holonyak, Jr. et al. | 330/149 |
| 2010/0103971 | A1 | 4/2010 | Then et al. | 372/45.01 |
| 2010/0202483 | A1 | 8/2010 | Walter et al. | 372/45.01 |
| 2010/0202484 | A1 | 8/2010 | Holonyak, Jr. et al. | 372/45.01 |
| 2010/0272140 | A1 | 10/2010 | Walter et al. | 372/38.02 |
| 2010/0289427 | A1 | 11/2010 | Walter et al. | 315/219 |
| 2010/0315018 | A1 | 12/2010 | Then et al. | 315/291 |
| 2011/0150487 | A1 | 6/2011 | Walter | 398/115 |
| 2012/0038960 | A1 | 2/2012 | Then et al. | 359/108 |
| 2012/0068151 | A1 | 3/2012 | Walter | 257/9 |

OTHER PUBLICATIONS

Optoelectronic Oscillator for Photonic Systems, X.S. Yao and L. Maleki, J. Quantum Elec., vol. 32 (7) (1996).

Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004).

Quantum-Well-Base Heterojunction Bipolar Light-Emitting Transistor, M. Feng, N. Holonyak, Jr., and R. Chan, Appl. Phys. Lett. 84, 1952 (2004).

Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004).

Laser Operation of a Heterojunction Bipolar Light-Emitting Transistor, G. Walter, N. Holonyak, Jr., M. Feng, and R. Chan, Appl. Phys. Lett. 85, 4768 (2004).

Microwave Operation and Modulation of a Transistor Laser, R. Chan, M. Feng, N. Holonyak, Jr., and G. Walter, Appl. Phys. Lett. 86, 131114 (2005).

Room Temperature Continuous Wave Operation of a Heterojunction Bipolar Transistor Laser, M. Feng, N. Holonyak, Jr., G. Walter, and R. Chan, Appl. Phys. Lett. 87, 131103 (2005).

Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006).

The Transistor Laser, N. Holonyak, M Feng, Spectrum, IEEE vol. 43, Issue 2, Feb. 2006.

Signal Mixing in a Multiple Input Transistor Laser Near Threshold, M. Feng, N. Holonyak, Jr., R. Chan, A. James, and G. Walter, Appl. Phys. Lett. 88, 063509 (2006).

Collector Current Map of Gain and Stimulated Recombination on the Base Quantum Well Transitions of a Transistor Laser, R. Chan, N. Holonyak, Jr., A. James, G. Walter, Appl. Phys. Lett. 88, 143508 (2006).

Collector Breakdown in The Heterojunction Bipolar Transistor laser, G. Walter, A. James, N. Holonyak, Jr., M. Feng, and R. Chan, Appl. Physics Lett. 88, 232105 (2006).

High-Speed (≥GHz) Electrical and Optical Adding, Mixing, and Processing of Square-Wave Signals With a Transistor Laser, M. Feng, N. Holonyak, Jr., R. Chan, A. James, and G. Walter, IEEE Photonics Technology Lett., vol. 18, No. 11, Jun. 1, 2006.

Graded-Base InGaN/GaN Heterojunction Bipolar Light-Emitting Transistors, B.F. Chu-Kung, M. Feng, G. Walter, and J. Holonyak, Jr. et al., Appl. Physics Lett. 89, 082108 (2006).

Carrier Lifetime and Modulation Bandwidth of a Quantum Well AlGaAs/InGaP/GaAs/InGaAs Transistor Laser, M. Feng, N. Holonyak, Jr., A. James, K. Cimino, G. Walter, and R. Chan, Appl. Phys. Lett 89, 113504 (2006).

Chirp in a Transistor Laser: Franz-Keldysh Reduction of the Linewidth Enhancement, G. Walter, A. James, N. Holonyak, Jr., and M. Feng, App. Phys. Lett. 90, 091109 (2007).

Photon-Assisted Breakdown, Negative Resistance, and Switching in a Quantum-Well Transistor Laser, A. James, G. Walter, M. Feng, and N. Holonyak, Jr., Appl. Phys. Lett. 90, 152109 (2007).

Franz—Keldysh Photon-Assisted Voltage-Operated Switching of a Transistor Laser, A. James, N. Holonyak, M. Feng, and G. Walter, Photonics Technology Letters, IEEE vol. 19 Issue: 9 (2007).

Experimental Determination of the Effective Minority Carrier Lifetime in the Operation of a Quantum-Well n-p-n Heterojunction Bipolar Light-Emitting Transistor of Varying Base Quantum-Well Design and Doping; H.W. Then, M. Feng, N. Holonyak, Jr., and C. H. Wu, Appl. Phys. Lett. 91, 033505 (2007).

Charge Control Analysis of Transistor Laser Operation, M. Feng, N. Holonyak, Jr., H. W. Then, and G. Walter, Appl. Phys. Lett. 91, 053501 (2007).

Optical Bandwidth Enhancement by Operation and Modulation of the First Excited State of a Transistor Laser, H. W. Then, M. Feng, and N. Holonyak, Jr., Appl. Phys. Lett. 91, 183505 (2007).

Modulation of High Current Gain ($\beta$>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007).

Collector Characteristics and the Differential Optical Gain of a Quantum-Well Transistor Laser, H. W. Then, G. Walter, M. Feng, and N. Holonyak, Jr., Appl. Phys. Lett. 91, 243508 (2007).

InAlGaAs/InP Light-Emitting Transistors Operating Near 1.55 μm, Yound Huang, Xue-Bing Zhang, Jae-Hyun Ryun, Russell D. Dupuis, Forest Dixon, Nick Holonyak, Jr., and Milton Feng., J. Appl. Phys. 103 114505 (2008).

Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008).

Optical Bandwidth Enhancement of Heterojunction Bipolar Transistor Laser Operation With an Auxiliary Base Signal, H.W. Then, G. Walter, M. Feng, and N. Holonyak, Jr., Appl. Phys. Lett. 93, 163504 (2008).

Bandwidth Extension by Trade-Off of Electrical and Optical Gain in a Transistor Laser: Three-Terminal Control, H. W. Then, M. Feng, and N. Holonyak, Jr., Appl. Phys. Lett. 94, 013509 (2009).

Tunnel Junction Transistor Laser, M. Feng, N. Holonyak, Jr., H. W. Then, C. H. Wu, and G. Walter, Appl. Phys. Lett. 94, 041118 (2009).

Electrical-Optical Signal Mixing and Multiplication (2 → 22 GHz) With a Tunnel Junction Transistor Laser, H.W. Then, C.H. Wu, G. Walter, M. Feng and N. Holonyak, Jr., Appl. Phys. Lett. 94, 10114 (2009).

Scaling of Light Emitting Transistor for Multigigahertz Optical Bandwidth, C.H. Wu, G. Walter, H.W. Then, M. Feng and N. Holonyak, Jr., Appl. Phys. Lett. 94, 171101 (2009).

Device Performance of Light Emitting Transistors With C-Doped and Zn-Doped Base Layers, Y. Huang, J.-H. Ryou, R.D. Dupuis, F. Dixon, N. Holonyak, Jr., and M. Feng, IPRM '09 IEEE Intl. Conf. May 10-14, 2009.

Tilted-Charge High Speed (7 GHz) Light Emitting Diode, G. Walter, C. H. Wu, H. W. Then, M. Feng, and N. Holonyak, Jr., Appl. Phys. Lett. 94, 231125 (2009).

4.3 GHz Optical Bandwidth Light Emitting Transistor, G. Walter, C. H. Wu, H. W. Then, M. Feng, and N. Holonyak, Jr., Appl. Phys. Lett. 94, 241101 (2009).

Resonance-Free Frequency Response of a Semiconductor Laser, M. Feng, H. W. Then, N. Holonyak, Jr., G. Walter, and A. James, Appl. Phys. Lett. 95, 033509 (2009).

4-GHz Modulation Bandwidth of Integrated 2X2 LED Array, Chao-Hsin Wu; Walter, G.; Han Wui Then; Feng, M.; Holonyak, N.; Photonics Technology Letters, IEEE vol. 21, Issue: 24 (2009).

Physics of Base Charge Dynamics in the Three Port Transistor Laser, H. W. Then, M. Feng, and N. Holonyak, Appl. Phys. Lett. 96, 113509 (2010).

Microwave Circuit Model of the Three-Port Transistor Laser, H. W. Then, M. Feng, and N. Holonyak, J. Appl. Phys. 107, 094509 (2010).

Distributed Feedback Transistor Laser, F. Dixon, M. Feng, and N. Holonyak, Appl. Phys. Lett. 96, 241103 (2010).

(56) References Cited

OTHER PUBLICATIONS

Stochastic Base Doping and Quantum-Well Enhancement of Recombination in an n-p-n Light-Emitting Transistor or Transistor Laser, H. W. Then, C. H. Wu, M. Feng, N. Holonyak, and G. Walter, Appl. Phys. Lett. 96, 263505 (2010).

Design and Operation of Distributed Feedback Transistor Lasers, F. Dixon, M. Feng, and N. Holonyak, Jr., Journal of Appl. Physics 108, 093109 (2010).

Temperature Dependence of a High-Performance Narrow-Stripe (1 μm) Single Quantum-Well Transistor Laser, M. Feng, N. Holonyak, Jr. and A. James, Appl. Physics Letters 98, 051107 (2011).

InP/InAlGaAs Light-Emitting Transistors and Transistor Lasers With a Carbon-Doped Base Layer, Yong Huang, Jae-Hyun Ryou, Russell Dupuis, Forest Dixon, Milton Feng, and Nick Holonyak, Jr., Journal of Appl. Physics 109, 063106 (2011).

Bandfilling and Photon-Assisted Tunneling in a Quantum-Well Transistor Laser, M. Feng, R. Bambery, and N. Holonyak, Jr., Appl. Physics Letters 98, 123505 (2011).

OPTO-ELECTRONIC OSCILLATOR AND METHOD

PRIORITY CLAIMS

Priority is claimed from U.S. Provisional Patent Application No. 61/627,230, filed Oct. 7, 2011 and priority is also claimed from U.S. Provisional Patent Application No. 61/686,202, filed Mar. 30, 2012, and both of said U.S. Provisional Patent Applications are incorporated herein by reference.

RELATED APPLICATIONS

Some of the subject matter of the present Application is related to some of the subject matter of the U.S. patent application Ser. No. 13/633,383, filed of even date herewith, and assigned to the same assignee as the present Application.

FIELD OF THE INVENTION

This invention relates to the field of oscillator circuits, systems, and methods and, more particularly, to opto-electronic oscillator circuits, systems and methods that exhibit ultra-low phase noise and ultra-stable frequency output.

BACKGROUND OF THE INVENTION

There are numerous applications where very high frequency signals, with ultra-low phase noise and ultra-stability of frequency are needed, some examples being radar, microwave and millimeter-wave integrated circuits (ICs), and analog and digital ICs.

A part of the background hereof lies in the development and availability of heterojunction bipolar transistors which operate as light-emitting transistors and transistor lasers. Reference can be made for example, to U.S. Pat. Nos. 7,091,082, 7,286,583, 7,354,780, 7,535,034, 7,693,195, 7,711,015, 7,813,396, 7,888,119, 7,888,625, and 7,953,133; U.S. Patent Application Publication Numbers US2005/0040432, US2005/0054172, US2008/0240173, US2009/0134939, US 2010/0315018, and US2010/0103971; and to PCT International Patent Publication Numbers WO/2005/020287 and WO/2006/093883. Reference can also be made to the following publications: Light-Emitting Transistor: Light Emission From InGaP/GaAs Heterojunction Bipolar Transistors, M. Feng, N. Holonyak, Jr., and W. Hafez, Appl. Phys. Lett. 84, 151 (2004); Quantum-Well-Base Heterojunction Bipolar Light-Emitting Transistor, M. Feng, N. Holonyak, Jr., and R. Chan, Appl. Phys. Lett. 84, 1952 (2004); Type-II GaAsSb/InP Heterojunction Bipolar Light-Emitting Transistor, M. Feng, N. Holonyak, Jr., B. Chu-Kung, G. Walter, and R. Chan, Appl. Phys. Lett. 84, 4792 (2004); Laser Operation Of A Heterojunction Bipolar Light-Emitting Transistor, G. Walter, N. Holonyak, Jr., M. Feng, and R. Chan, Appl. Phys. Lett. 85, 4768 (2004); Microwave Operation And Modulation Of A Transistor Laser, R. Chan, M. Feng, N. Holonyak, Jr., and G. Walter, Appl. Phys. Lett. 86, 131114 (2005); Room Temperature Continuous Wave Operation Of A Heterojunction Bipolar Transistor Laser, M. Feng, N. Holonyak, Jr., G. Walter, and R. Chan, Appl. Phys. Lett. 87, 131103 (2005); Visible Spectrum Light-Emitting Transistors, F. Dixon, R. Chan, G. Walter, N. Holonyak, Jr., M. Feng, X. B. Zhang, J. H. Ryou, and R. D. Dupuis, Appl. Phys. Lett. 88, 012108 (2006); The Transistor Laser, N. Holonyak and M Feng, Spectrum, IEEE Volume 43, Issue 2, February 2006; Signal Mixing In A Multiple Input Transistor Laser Near Threshold, M. Feng, N. Holonyak, Jr., R. Chan, A. James, and G. Walter, Appl. Phys. Lett. 88, 063509 (2006); Collector Current Map Of Gain And Stimulated Recombination On The Base Quantum Well Transitions Of A Transistor Laser, R. Chan, N. Holonyak, Jr., A. James, and G. Walter, Appl. Phys. Lett. 88, 14508 (2006); Collector Breakdown In The Heterojunction Bipolar Transistor Laser, G. Walter, A. James, N. Holonyak, Jr., M. Feng, and R. Chan, Appl. Phys. Lett. 88, 232105 (2006); High-Speed (/spl ges/1 GHz) Electrical And Optical Adding, Mixing, And Processing Of Square-Wave Signals With A Transistor Laser, M. Feng, N. Holonyak, Jr., R. Chan, A. James, and G. Walter, Photonics Technology Letters, IEEE Volume: 18 Issue: 11 (2006); Graded-Base InGaN/GaN Heterojunction Bipolar Light-Emitting Transistors, B. F. Chu-Kung et al., Appl. Phys. Lett. 89, 082108 (2006); Carrier Lifetime And Modulation Bandwidth Of A Quantum Well AlGaAs/InGaP/GaAs/InGaAs Transistor Laser, M. Feng, N. Holonyak, Jr., A. James, K. Cimino, G. Walter, and R. Chan, Appl. Phys. Lett. 89, 113504 (2006); Chirp In A Transistor Laser, Franz-Keldysh Reduction of The Linewidth Enhancement, G. Walter, A. James, N. Holonyak, Jr., and M. Feng, Appl. Phys. Lett. 90, 091109 (2007); Photon-Assisted Breakdown, Negative Resistance, And Switching In A Quantum-Well Transistor Laser, A. James, G. Walter, M. Feng, and N. Holonyak, Jr., Appl. Phys. Lett. 90, 152109 (2007); Franz-Keldysh Photon-Assisted Voltage-Operated Switching of a Transistor Laser, A. James, N. Holonyak, M. Feng, and G. Walter, Photonics Technology Letters, IEEE Volume: 19 Issue: 9 (2007); Experimental Determination Of The Effective Minority Carrier Lifetime In The Operation Of A Quantum-Well n-p-n Heterojunction Bipolar Light-Emitting Transistor Of Varying Base Quantum-Well Design And Doping; H. W. Then, M. Feng, N. Holonyak, Jr., and C. H. Wu, Appl. Phys. Lett. 91, 033505 (2007); Charge Control Analysis Of Transistor Laser Operation, M. Feng, N. Holonyak, Jr., H. W. Then, and G. Walter, Appl. Phys. Lett. 91, 053501 (2007); Optical Bandwidth Enhancement By Operation And Modulation Of The First Excited State Of A Transistor Laser, H. W. Then, M. Feng, and N. Holonyak, Jr., Appl. Phys. Lett. 91, 183505 (2007); Modulation Of High Current Gain (β>49) Light-Emitting InGaN/GaN Heterojunction Bipolar Transistors, B. F. Chu-Kung, C. H. Wu, G. Walter, M. Feng, N. Holonyak, Jr., T. Chung, J.-H. Ryou, and R. D. Dupuis, Appl. Phys. Lett. 91, 232114 (2007); Collector Characteristics And The Differential Optical Gain Of A Quantum-Well Transistor Laser, H. W. Then, G. Walter, M. Feng, and N. Holonyak, Jr., Appl. Phys. Lett. 91, 243508 (2007); Transistor Laser With Emission Wavelength at 1544 nm, F. Dixon, M. Feng, N. Holonyak, Jr., Yong Huang, X. B. Zhang, J. H. Ryou, and R. D. Dupuis, Appl. Phys. Lett. 93, 021111 (2008); Optical Bandwidth Enhancement Of Heterojunction Bipolar Transistor Laser Operation With An Auxiliary Base Signal, H. W. Then, G. Walter, M. Feng, and N. Holonyak, Jr. Appl. Phys. Lett. 93, 163504 (2008); Bandwidth Extension By Trade-Off Of Electrical And Optical Gain In A Transistor Laser, Three-Terminal control, H. W. Then, M. Feng, and N. Holonyak, Jr. Appl. Phys. Lett. 94, 013509 (2009); Tunnel Junction Transistor Laser, M. Feng, N. Holonyak, Jr., H. W. Then, C. H. Wu, and G. Walter, Appl. Phys. Lett 94, 041118 (2009); Electrical-Optical Signal Mixing And Multiplication (2→22 GHz) With A Tunnel Junction Transistor Laser, H. W. Then, C. H. Wu, G. Walter, M. Feng, and N. Holonyak, Jr. Appl. Phys. Lett. 94, 101114 (2009); Scaling Of Light Emitting Transistor For Multigigahertz Optical Bandwidth, C. H. Wu, G. Walter, H. W. Then, M. Feng, and N. Holonyak, Jr., Appl. Phys. Lett, 94, 171101 (2009); Device Performance Of Light Emitting Transistors With C-Doped And Zn-Doped Base Layers, Y. Huang, J.-H. Ryou, R. D. Dupuis, F. Dixon, N. Holonyak, M. Feng, Indium Phosphide & Related Materials, 2009; IPRM '09. IEEE International Conference On 10-14 May 2009; Tilted-Charge High Speed (7 GHz) Light Emitting Diode, G. Walter, C. H. Wu, H. W. Then, M. Feng, and N. Holonyak, Jr. Appl. Phys. Lett. 94, 231125 (2009); 4.3 GHz Optical Bandwidth Light Emitting Transistor, G. Walter, C. H. Wu, H. W. Then, M. Feng, and N. Holonyak, Jr., Appl. Phys. Lett. 94, 241101 (2009); Resonance-Free Frequency Response Of A Semiconductor Laser, M. Feng, H. W. Then, N. Holonyak, Jr., G. Walter, and A. James, Appl. Phys. Lett. 95, 033509 (2009); 4-GHz Modulation Bandwidth of Integrated 2×2 LED Array, Chao-Hsin Wu; G. Walter, Han Wui Then, M. Feng, N. Holonyak, Photonics Technology Letters, IEEE Volume: 21, Issue 24, Publication Year: 2009, Page(s): 1834-1836, Date of Publication: 9 Nov. 2009; Physics Of Base Charge Dynamics In The Three Port Transistor Laser, H. W. Then, M. Feng, and N. Holonyak Appl. Phys. Lett. 96, 113509 (2010); Microwave Circuit Model Of The Three-Port Transistor Laser, H. W. Then, M. Feng, and N. Holonyak, J. Appl. Phys. 107, 094509 (2010); Distributed Feedback Transistor Laser, F. Dixon, M. Feng, and N. Holonyak; Appl. Phys. Lett. 96, 241103 (2010); Stochastic Base Doping And Quantum-Well Enhancement Of Recombination In $A_n$ n-p-n Light-Emitting Transistor Or Transistor Laser, H. W. Then, C. H. Wu, M. Feng, N. Holonyak, and G. Walter, Appl. Phys. Lett. 96, 263505 (2010); Design And Operation Of Distributed Feedback Transistor Lasers, F. Dixon, M. Feng, and N. Holonyak, J. Appl. Phys. 108, 093109 (2010); and Temperature Dependence Of A High-Performance Narrow-Stripe (1 μm) Single Quantum-Well Transistor Laser, M. Feng, N. Holonyak, and A. James, Appl. Phys. Lett. 98, 051107 (2011). The foregoing documents describe, inter alia, the structure and operation of light-emitting transistors (LETs) and transistor lasers (TLs), at least some of which being of types that can be employed in making or practicing embodiments of the invention.

It is among the objectives hereof to improve on existing oscillator circuits and techniques by improving one or more of the noise immunity, stability, modularity, ease of integration, and cost of such circuits and methods.

SUMMARY OF THE INVENTION

In accordance with a form of the invention, there is provided, a scalable differential triple-loop architecture that has features including the following: (1) The architecture of an embodiment hereof takes advantages of three loops (electronic, opto-electronic and purely optical) that are fundamentally injection locked together to increase the output RF oscillation stability. (2) A differential oscillator of an embodiment hereof increases the circuit's immunity to noise resulting from power supply and ground potential fluctuations, and also increases the equivalent round trip delay of the optical signal in the loop, increasing the total Q. (3) The fundamental architecture of an embodiment hereof is developed as a unit cell that can easily be cascaded. By cascading multiple identical cells, it is possible to achieve an RF phase noise that is reduced proportional to the square of the number of cells in the architecture. The paradigm of cascading multiple unit cells can therefore be used to great advantage in achieving an RF output with ultra low phase noise performance.

In a form of the invention, an opto-electronic oscillator circuit is set forth, and includes: an opto-electronic circuit loop including an optical modulator that receives a first electrical signal and produces an optical output signal coupled with an optical resonator, a photodetector circuit optically coupled with said optical resonator, and a phase shifter coupled with said photodetector circuit for producing a phase shifted output signal that is fed back as said first electrical signal; an optical loop comprising the optical coupling of said optical resonator with said photodetector; and an electrical feedback circuit loop for coupling said first electrical signal with said photodetector circuit.

In an embodiment of this form of the invention, the electrical feedback circuit loop includes a filter coupling said first electrical signal with said photodetector circuit, and an output buffer coupled with said first electrical signal for producing a buffered output signal. Also in this embodiment, the optical modulator comprises a transistor laser, and the optical resonator comprises an injection-locked transistor laser optical amplifier. The opto-electronic oscillator circuit in accordance with this embodiment can advantageously have the photodetector, the transistor laser, and the transistor laser optical amplifier formed on a chip using a common layer structure.

Using embodiments of the described form of the invention, a differential oscillator can be devised using first and second half-cells, each half-cell comprising the previously described oscillator circuits, said half-cells being coupled together in differential arrangement. The half-cells can have differentially coupled electro-optical loops, whereby, the combined electro-optical loop length is twice the half-cell electro-optical loop length.

In accordance with a further form of the invention, an opto-electronic oscillator circuit, is set forth, and includes: an opto-electronic circuit loop including a transistor laser optical modulator that receives a first electrical signal and produces a laser optical output signal coupled with a transistor optical amplifier, a photodetector optically coupled with said transistor optical amplifier, and a phase shifter coupled with said photodetector for producing a phase shifted signal that is fed back to said transistor laser as said first electrical signal; and an optical loop comprising an injection locking optical resonator optically coupled with said transistor optical amplifier.

In an embodiment of this further form of the invention, the photodetector comprises a transistor photodetector and the transistor laser, the transistor optical amplifier, and the transistor photodetector have a common layer structure. Also in this embodiment a matching network and an electrical amplifier couple the photodetector with the phase shifter, and an output buffer is coupled with the output of said electrical amplifier for producing a buffered output signal.

Again, using embodiments of this form of the invention, a differential oscillator can be devised using first and second half-cells, each half-cell comprising the previously described oscillator circuits, said half-cells being coupled together in differential arrangement.

In accordance with a form of the method of the invention, a technique is provided for producing stable oscillating signals, including the following steps: providing an opto-electronic circuit loop including an optical modulator that receives a first electrical signal and produces an optical output signal coupled with an optical resonator, a photodetector circuit optically coupled with said optical resonator, and a phase shifter coupled with said photodetector circuit for producing a phase shifted output signal that is fed back to said optical modulator as said first electrical signal; providing an optical loop comprising the optical coupling of said optical resonator with said photodetector circuit; and providing an electrical feedback circuit loop for coupling said first electrical signal with said photodetector circuit.

In accordance with a further form of the method of the invention, a technique is provided for producing stable oscillating signals, including the following steps: providing an opto-electronic circuit loop including a transistor laser optical modulator that receives a first electrical signal and produces a laser optical output signal coupled with a transistor optical amplifier, a photodetector optically coupled with said transistor optical amplifier, and a phase shifter coupled with said photodetector for producing a phase shifted signal that is fed back to said transistor laser as said first electrical signal; and providing an optical loop comprising an injection locking optical resonator optically coupled with said transistor optical amplifier.

Further features and advantages of the invention will become more readily apparent from the following detailed description when taken in conjunction with the accompanying drawings.

BRIEF DESCRIPTION OF THE DRAWINGS

FIG. 2, which includes In FIG. 2A the electronic loops of two half-cells are coupled, in FIG. 2B the opto-electronic loops of two half-cells are coupled, and in FIG. 2C the optical loops of two half-cells are coupled. In the case of the opto-electronic loop, which is stabilized by two purely optical loops, the loop length is doubled in length, reducing the FWHM (full width at half maximum) by a factor of four.

DETAILED DESCRIPTION

Figure 1:
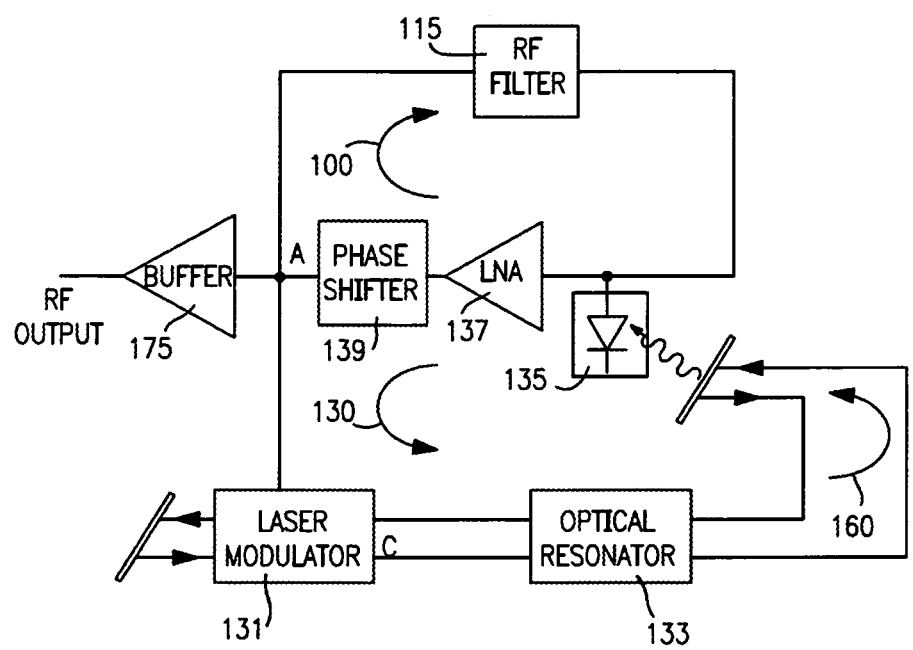
FIG. 1 is a schematic diagram, partially in block form, showing the basic architecture and operation of a triple loop half-cell opto-electronic oscillator in accordance with an embodiment of the invention and which can be used in practicing embodiments of the method of the invention. The oscillator of this embodiment includes an opto-electronic loop, an optical loop, and an RF electronic feedback loop.

An embodiment showing the triple loop nature of the half-circuit unit cell is illustrated in FIG. 1. The half-cell architecture of this embodiment includes three loops: an RF loop 100, an opto-electronic loop 130, and an optical loop 160. The opto-electronic loop in the opto-electronic oscillator (OEO) topology includes a laser modulator 131, a high Q optical resonator 133, a photodetector 135, a low noise amplifier (LNA) 137 and a phase shifter 139. Though the LNA provides rudimentary RF filtering, the present embodiment includes the addition of an electrical RF loop (100) coupled with the opto-electronic loop (130). This electronic loop 100 includes RF filter 115 and performs a filtering function to select the RF optical mode. The loop 160 is a purely optical loop, which, as noted above, contains laser modulator 131 (which is preferably a transistor laser modulator), and high-Q optical resonator 133, as well as optical feedback. Note that there is no O/E or E/O conversion in such an optical loop, the Q factor of the optical loop being much higher than the Q of the opto-electronic loop. As the optoelectronic loop 130 and optical loop 160 are coupled through the common laser modulator 131 and optical resonator 133, the opto-electronic loop 130 is optical-injection locked by the high-Q optical loop 160, which greatly improves the oscillation stability. This optically stabilized opto-electronic loop 130 is then filtered by the RF loop 100 to select the RF mode, providing an ultra-low phase noise RF signal (at A), which is output via output buffer 175. Optical output can be taken, for example, at C.

Figure 2A:
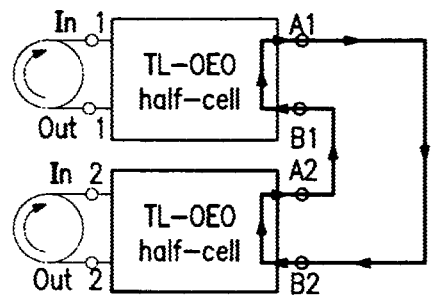
FIGS. 2A, 2B and 2C, show diagrams illustrating the fully-differential transistor laser opto-electronic oscillator (TLOEO) topology, with each of the three different loops being denoted. In each case the OEO inputs are represented at A1, B1 and A2, B2, and the optical loops show In1, Out1 and In2. Out2.
Figure 2B:
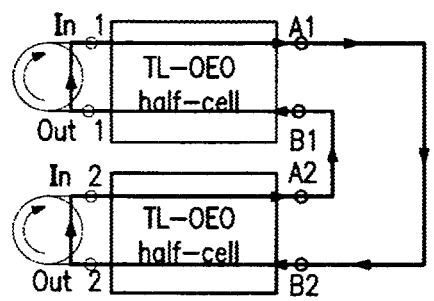
Figure 2C:
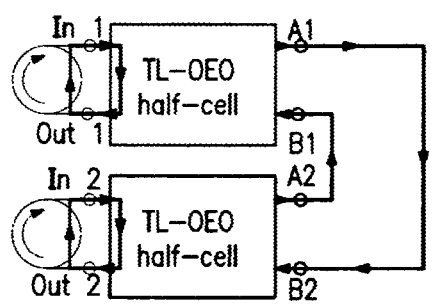

An advantage of the half cell topology is that it can be configured in multiple ways to produce different outputs and achieve higher stability performance. One beneficial configuration is as a differential OEO, in which two OEO half-cells are cross-coupled electrically to provide differential operation, and to double the overall delay time of the OEO, as shown in FIG. 2. The FIG. 2A configuration has two half-cells coupled with respect to their electronic loops, the FIG. 2B configuration has two half-cells coupled with respect to their opto-electronic loops, and FIG. 2C has two half-cells coupled with respect to their optical loops. As in differential electronic circuits, any noise that couples into the differential system in such a way that it affects the half-circuits identically (common mode variations) will not propagate to the differential outputs. Therefore, through the use of differential signaling circuits, there is reduction of the noise that perturbs cavity oscillation.

The power spectral density of an opto-electronic oscillator (OEO) is derived to be, $$S_{RF}(f) = \frac{P(f)}{\Delta f \cdot P_{osc}} \propto \frac{RIN}{(\tau)^2} \quad (1)$$

where the RIN is the laser relative intensity noise and τ is the total group delay of the opto-electronics loop. Having a differential architecture also permits inclusion of two high-Q optical resonators to double the opto-electronic group delay, therefore doubling the overall Q of the oscillator. Thus, for the differential arrangement, this will achieve 4× higher spectral purity, FWHM~$1/\tau^2$, where τ is the total group delay of the opto-electronics loop and is now double (2×), accordingly reducing the noise of the RF output.

Figure 3:
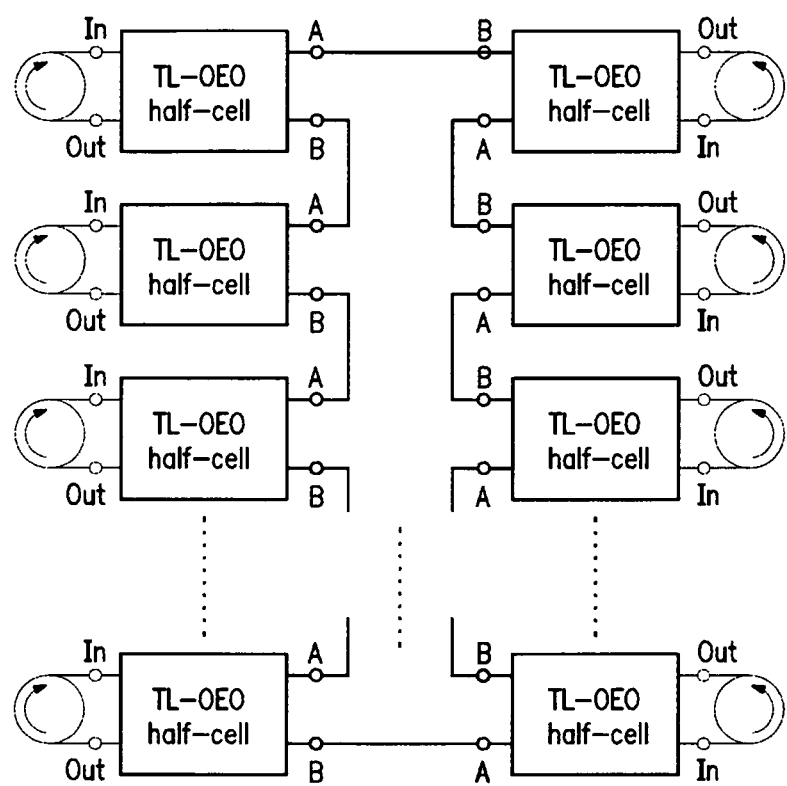
FIG. 3 is a diagram, partially in block form, representing N transistor laser opto-electronic half cells, used to reduce FWHM by about $1/N^2$.

Further, the opto-electronic oscillator unit cell hereof is scalable to N-cells for enhancing spectral purity scaling with total group delay $1/\tau^2$~$1/N^2$ and is suitable for on-chip integration. Reference can be made to FIG. 3, which shows a configuration of N (for N an even integer) transistor laser optoelectronic oscillator (TL-OEO) half cells to reduce FWHM by ~$1/N^2$. If N=2, then the architecture would reduce to that of the differential full cell TL-OEO.

The described architecture is advantageous in that it implements the coupling of energy into multiple high-Q resonators during a single round trip around the loop, significantly increasing the Q-factor of the opto-electronic loop. Since each additional cell can have its own transistor laser with built in modulator, there is no need for concern about a significant energy coupling loss through a series of resonators, since the multiple lasers around the oscillating loop will act as the power repeaters. This scaling approach enables development of a multi-cell TL-OEO to provide an RF signal source with any desired phase noise performance, within practical limitations.

Another notable aspect of this configuration is that each half-cell is operating at a phase of 360°/N relative to the previous half-cell. This trait is realized when considering that the total round-trip opto-electronic signal gain has a phase of 360° and that all half-cells are substantially identical and will have equal signal delays across them, e.g. N=2 giving a differential oscillator (180° difference between cells). This trait allows for ultra-high stability sources with precise relative phases, and are beneficial, for example, as an ultra-stable quadrature source (90° phase difference, N=4) for precise high-frequency transceiver systems.

Figure 4:
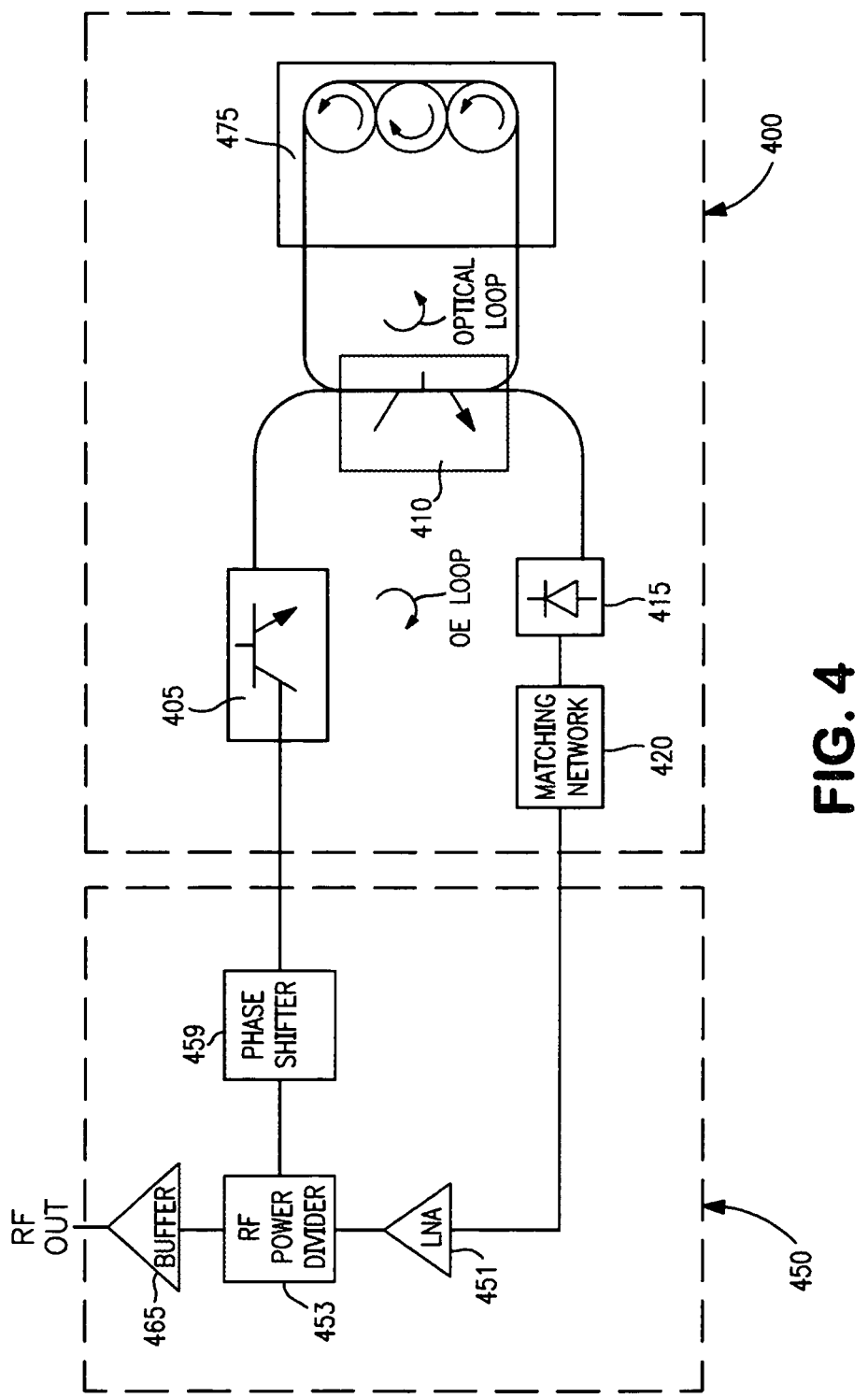
FIG. 4 illustrates an embodiment of a transistor laser opto-electronic half-cell, showing the opto-electronic and optical loops, implemented using a transistor laser photonic chip that can employ a common III-V layer structure and a CMOS electronics chip.

FIG. 4 illustrates an embodiment of the transistor laser opto-electronic oscillator half cell, showing details of the opto-electronic and optical loops, utilizing a transistor laser photonics integrated circuit and/or chip 400 that can utilize a common III-V semiconductor layer structure, and a CMOS electronic integrated circuit and/or chip 450. The circuit 400 includes, as part of opto-electronic loop 130, a transistor laser modulator 405, a transistor optical amplifier 410, a transistor photodetector 415 and a matching network 420. The further portion of the opto-electronic loop, in the CMOS electronics 450, includes low-noise amplifier 451, RF power divider 453, and phase shifter 459, the output of which is coupled with transistor laser 405. In a preferred embodiment, the transistor optical amplifier is a transistor laser optical amplifier (TLOA) of the type disclosed is copending U.S. patent application Ser. No. 13/633,383, filed of even date herewith and assigned to the same assignee as the present Application. [In the TLOA, an optical signal, such as a laser beam, input to the base region of a laser transistor, can be amplified or attenuated in accordance with electronic control signals applied to the transistor laser.] The optical amplifier 410 is coupled, in the optical loop 160, with injection locking high-Q resonator 475 which may be, for example, of the type disclosed in U.S. Pat. No. 7,869,472. As in the FIG. 1 embodiment, the optical output (C) can be taken at the output of the TL modulator 405. The output electrical signal, in this embodiment, can be taken at the output of buffer 465.

A preferred embodiment of the half-cell OEO architecture employs a common-emitter (CE) configured transistor laser (405) that is RF modulated at the base-collector (BC) junction by the electrical OEO feedback signal. The electrical signal applied to the collector serves to modulate the output beam through Franz-Keldysh absorption at the BC junction, leading to a very high extinction ratio (see e.g. M. Feng. N. Holonyak, Jr. H. W. Then, C. H. Wu and G. Walter, Appl. Phys. Lett. 94 041118 (2009), and other TL documents first listed above), which has been shown to be beneficial in low-noise OEO operation (see X. Yao and L. Maleki, IEEE J. Qunatum Electronics, vol. 32, No. 7, p 1141 to 1149, 1996). The in-line transistor optical amplifier (TOA) 410 coupled to the transistor laser compensates for the optical loss of the delay line and, by increasing the overall loop gain, provides flexibility in the design of the CMOS electrical amplification. An advantage of this embodiment is that it confines all optical signals to the III-V chip. This eliminates inter-chip optical coupling loss, but necessitates electrical connection of the low impedance photo-detector (PD) output signal between chips. The present embodiment includes a frequency-selective impedance matching network on the III-V substrate to perform the dual functions of impedance transforming the PD output and filtering the OEO mode at, for example, 20 GHz, or any frequency selected in the range about 1 GHz to 2 THz. By transforming the PD's output, a low-loss high impedance line is driven to electrically connect the two chips, thereby reducing losses. The CMOS chip architecture is simplified by the integration of several components on the III-V substrate. On the CMOS chip, the low-noise amplifier (LNA) 451 drives the power driver/divider 453, which feeds the signal back to the modulation input of the transistor laser and to the output buffer 465. In this embodiment, the power divider is designed to drive the moderate-impedance (typically ~30 ohm) modulation input of the transistor laser. The output buffer is designed to deliver the required output power while injecting a minimum amount of noise back into the OEO.

Figure 5:
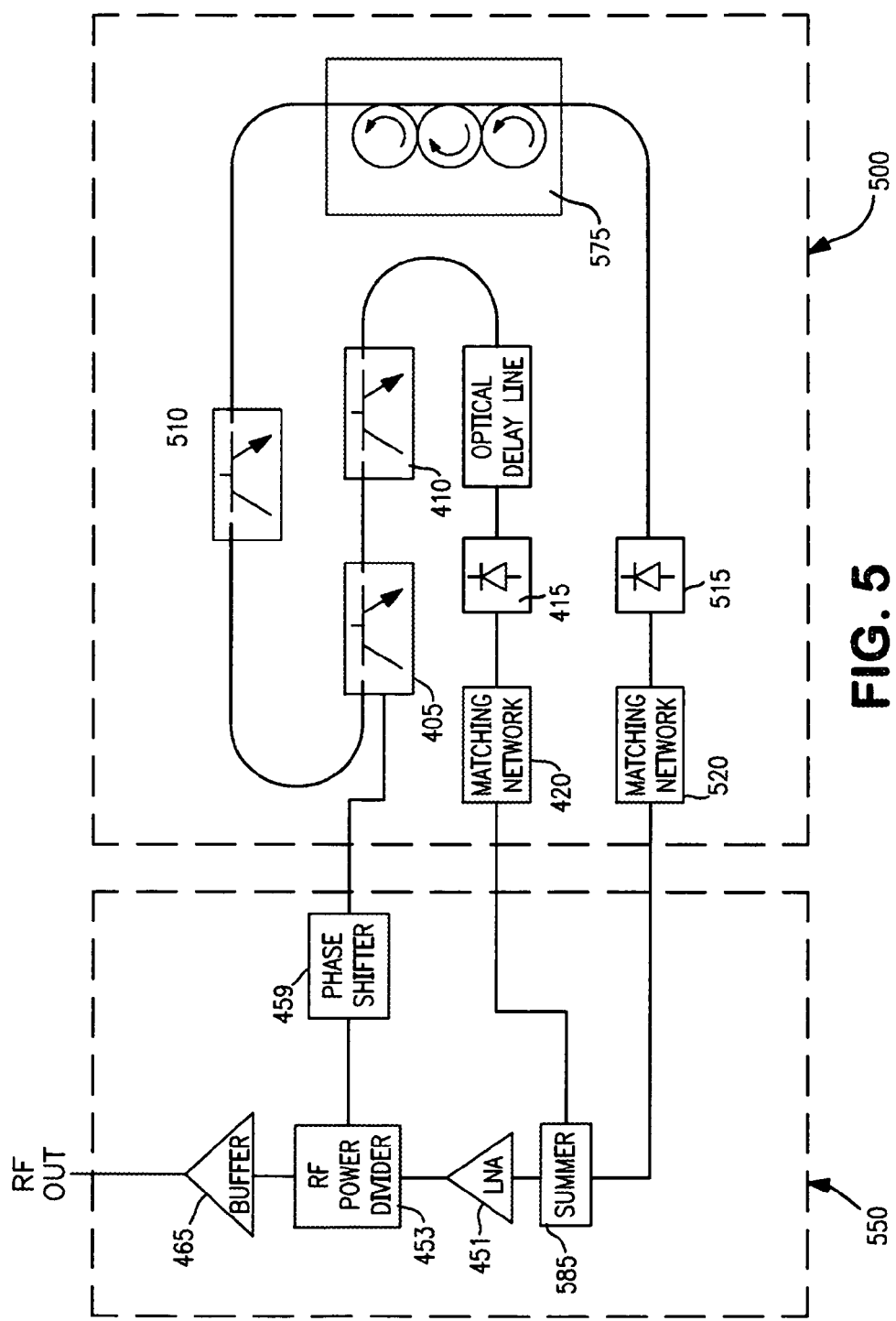
FIG. 5 illustrates an embodiment of an electrical injection locking transistor laser opto-electronic oscillator architecture that exhibits improved phase noise reduction, again employing a common III-V layer structure and a CMOS electronics chip.

FIG. 5 illustrates a further embodiment that utilizes electrical injection locking and achieves improved phase noise reduction. In this embodiment, the III-V transistor laser photonics portion is designated 500, and the CMOS electronics portion is designated 550. The transistor laser modulator 405, transistor optical amplifier (TOA) 410, transistor photodetector 415 and matching network 420 in the photonics portion 500, and the low-noise amplifier 451, RF power divider 453, phase shifter 459, and output buffer 465 in the CMOS electronics portion 550, can be similar to their counterparts of like reference numerals in FIG. 4. In this embodiment, however, a further opto-electronic loop includes another transistor optical amplifier (TOA) 510, a high-Q resonator 575, another transistor photodetector 515 and another matching network 520. In the CMOS electronics portion, a summing circuit 585 receives and sums the outputs of the matching networks 420 and 520, and the output of summer 585 is coupled to power driver/divider 453. As seen, in the electrical injection locking architecture, of this embodiment, two opto-electronic loops are employed but with different optical loop lengths. Due to the different optical delays, only the common mode which satisfies both phase matching conditions in each loop can be selected. In addition, since these two opto-electronic loops are coupled via the common transistor laser and the summer, they are mutually injection-locked. The common mode optical signal is converted to an electrical signal via a photodetector in each loop, and mixed together through the summer. With sufficient power gain and phase matching condition provided by the RF amplifier and phase shifter, the electrical injection locked TLOEO of this embodiment will self-oscillate with stable output and ultra-low phase noise.

The invention has been described with reference to particular preferred embodiments, but variations within the spirit and scope of the invention will occur to those skilled in the art. For example, it will be understood that output electrical and/or optical signals may sometimes be taken at appropriate alternative positions of the oscillators.

The invention claimed is:

1. An opto-electronic oscillator circuit, comprising:
   an opto-electronic circuit loop including a transistor laser optical modulator that receives a first electrical signal and produces a laser optical output signal coupled with a transistor optical amplifier, a photodetector optically coupled with said transistor optical amplifier, and a phase shifter coupled with said photodetector for producing a phase shifted signal that is fed back to said transistor laser as said first electrical signal; and
   an optical loop comprising an injection locking optical resonator optically coupled with said transistor optical amplifier.

2. The opto-electronic oscillator as defined by claim 1, wherein said photodetector comprises a transistor photodetector and wherein said transistor laser, said transistor optical amplifier, and said transistor photodetector have a common layer structure.

3. The opto-electronic oscillator as defined by claim 1, further comprising a matching network and an electrical amplifier coupling said photodetector with said phase shifter.

4. The opto-electronic oscillator as defined by claim 1, further comprising an output buffer coupled with the output of said electrical amplifier for producing a buffered output signal.

5. The opto-electronic oscillator as defined by claim 1, wherein said transistor optical amplifier comprises a transistor laser optical amplifier.

6. A differential oscillator comprising first and second half-cells, each half-cell being defined by the oscillator of claim 1, said half-cells being coupled together in differential arrangement.

7. A differential oscillator comprising N half-cells, each half-cell being defined by the oscillator of claim 1, said half-cells being coupled together in a string of differentially arranged pairs.

8. A method for producing stable oscillating signals, comprising the steps of:
providing an opto-electronic circuit loop including a transistor laser optical modulator that receives a first electrical signal and produces a laser optical output signal coupled with a transistor optical amplifier, a photodetector optically coupled with said transistor optical amplifier, and a phase shifter coupled with said photodetector for producing a phase shifted signal that is fed back to said transistor laser as said first electrical signal; and
providing an optical loop comprising an injection locking optical resonator optically coupled with said transistor optical amplifier.

9. The method as defined by claim 8, wherein the providing of said photodetector comprises providing a transistor photodetector, and further comprising providing said transistor laser, said transistor optical amplifier, and said transistor photodetector with a common layer structure.

10. The method as defined by claim 8, further comprising providing a matching network and an electrical amplifier coupling said photodetector with said phase shifter.

11. The method as defined by claim 8, further comprising providing an output buffer coupled with the output of said electrical amplifier for producing a buffered output signal.

12. The opto-electronic oscillator as defined by claim 1, further comprising a second opto-electronic circuit loop coupled with said first-mentioned opto-electronic circuit loop.

13. The opto-electronic oscillator as defined by claim 12, wherein said first-mentioned and said second opto-electronic circuit loops are coupled in series.

14. The opto-electronic oscillator as defined by claim 13, wherein said first-mentioned opto-electronic circuit loop and said second opto-electronic circuit loop have respectively different optical loop lengths.

15. The opto-electronic oscillator as defined by claim 14, wherein said second opto-electronic circuit loop includes an optical delay line, a second transistor laser optically coupled with a second transistor optical amplifier, a second photodetector optically coupled with said second transistor optical amplifier, and a second phase shifter coupled with said second photodetector.

16. The method as defined by claim 8, further comprising providing a second opto-electronic circuit loop coupled with said first-mentioned opto-electronic circuit loop.

17. The method as defined by claim 16, wherein said first-mentioned and said second opto-electronic circuit loops are provided as being coupled in series.

18. The method as defined by claim 17, wherein said first-mentioned opto-electronic circuit loop and said second opto-electronic circuit loop are provided as having respectively different optical loop lengths.

19. The method as defined by claim 18, wherein said second opto-electronic circuit loop is provided as including an optical delay line, a second transistor laser optically coupled with a second transistor optical amplifier, a second photodetector optically coupled with said second transistor optical amplifier, and a second phase shifter coupled with said second photodetector.

* * * * *